United States Patent
Yen et al.

(10) Patent No.: US 9,312,221 B2
(45) Date of Patent: Apr. 12, 2016

(54) VARIABLE CAPACITANCE DEVICES

(71) Applicant: Taiwan Semiconductor Manufacturing Co., Ltd., Hsin-Chu (TW)

(72) Inventors: Hsiao-Tsung Yen, Tainan (TW); Cheng-Wei Luo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/916,620

(22) Filed: Jun. 13, 2013

(65) Prior Publication Data

US 2014/0367831 A1    Dec. 18, 2014

(51) Int. Cl.
| H01L 29/93 | (2006.01) |
| H01L 23/522 | (2006.01) |
| H01L 29/66 | (2006.01) |
| H01L 29/8605 | (2006.01) |
| H01L 49/02 | (2006.01) |
| H01L 27/06 | (2006.01) |

(52) U.S. Cl.
CPC ........ *H01L 23/5223* (2013.01); *H01L 23/5225* (2013.01); *H01L 28/40* (2013.01); *H01L 29/66166* (2013.01); *H01L 29/8605* (2013.01); *H01L 27/0682* (2013.01); *H01L 2924/0002* (2013.01)

(58) Field of Classification Search
CPC ......... H01L 28/20; H01L 28/40; H01L 28/60; H01L 27/0629; H01L 23/5223
USPC .......................................... 257/533, 536, 595
See application file for complete search history.

(56) References Cited

U.S. PATENT DOCUMENTS

| 6,198,123 | B1 * | 3/2001 | Linder et al. ................... 257/306 |
| 6,414,541 | B1 | 7/2002 | Arvidsson et al. |
| 6,737,698 | B1 * | 5/2004 | Paul et al. ...................... 257/306 |
| 7,336,134 | B1 | 2/2008 | Janesch et al. |
| 8,237,243 | B2 * | 8/2012 | Daley et al. ................... 257/532 |
| 8,653,598 | B2 * | 2/2014 | Chen ............................. 257/350 |
| 2010/0327902 | A1 * | 12/2010 | Shau ............................... 326/30 |

OTHER PUBLICATIONS

U.S. Appl. No. 13/789,825, filed Mar. 8, 2013.

* cited by examiner

*Primary Examiner* — Howard Weiss
(74) *Attorney, Agent, or Firm* — Duane Morris LLP

(57) ABSTRACT

A variable capacitance device includes a capacitor having a first capacitance and a variable resistor coupled in series with the capacitor. The variable resistor includes a gate structure formed over a channel region defined in a doped well formed in a semiconductor substrate. A resistance of the variable resistor is based on a voltage applied to the gate structure, which adjusts a resistance of the channel and a capacitance of the variable capacitance device.

15 Claims, 18 Drawing Sheets

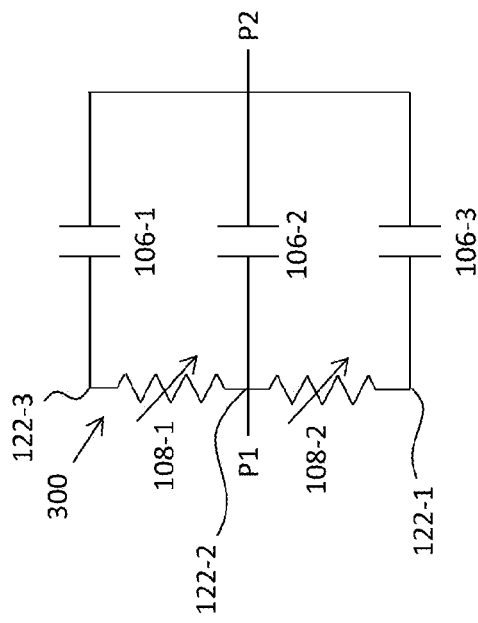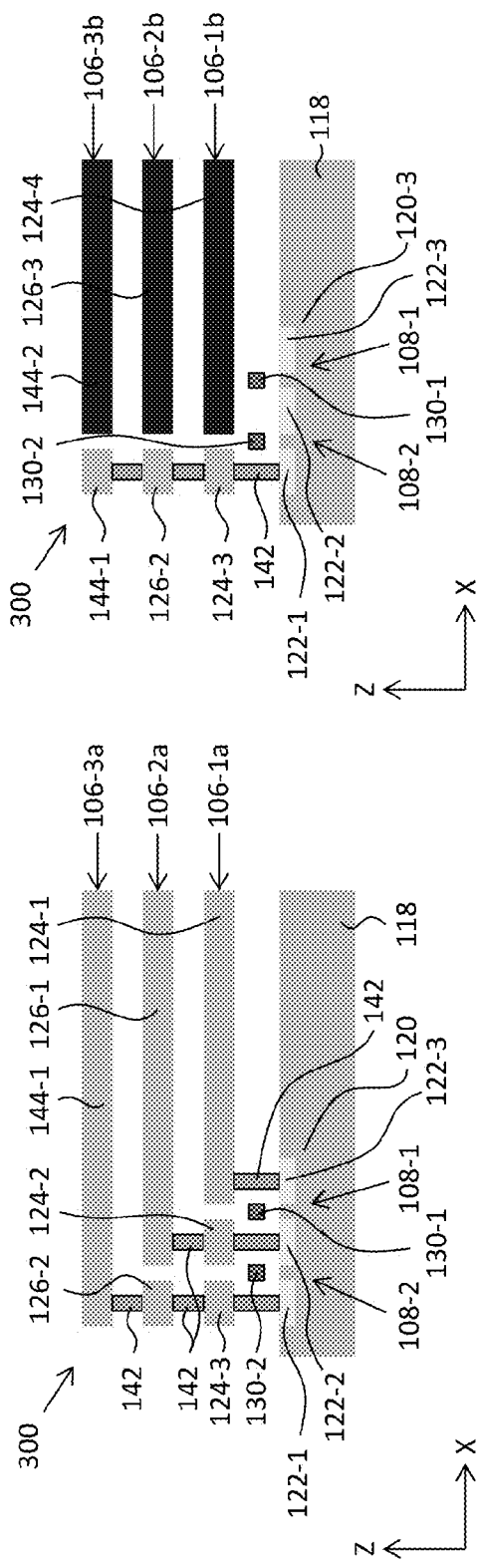

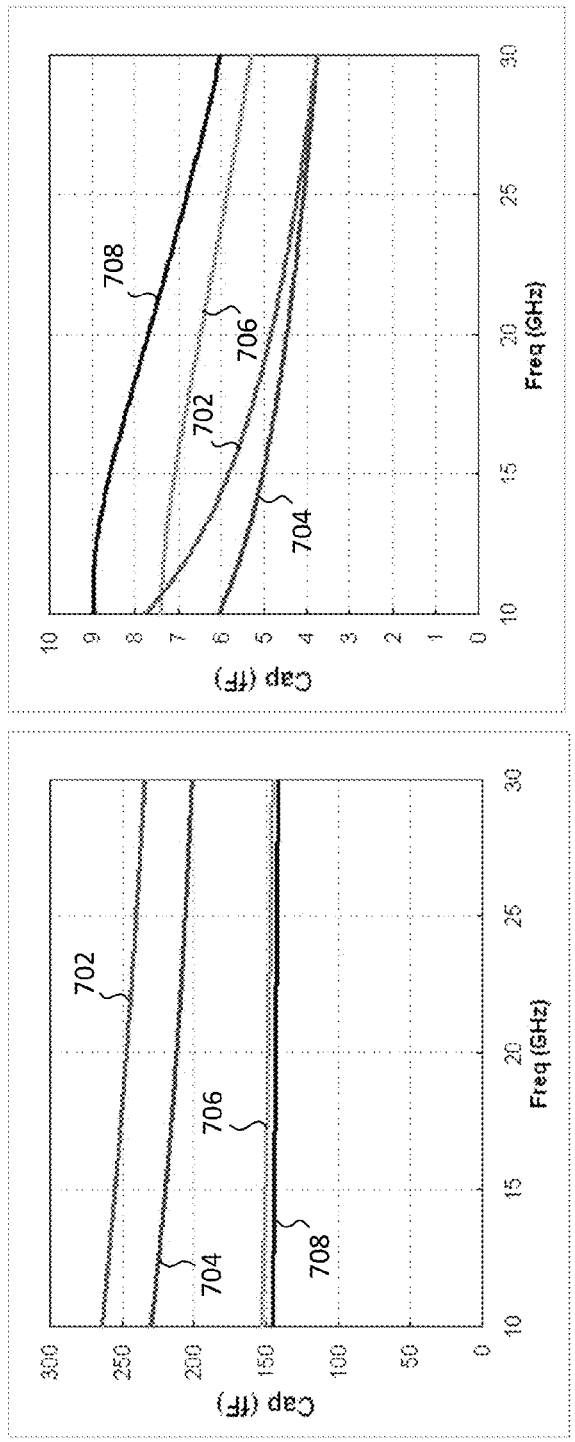
FIG. 7C
FIG. 7D
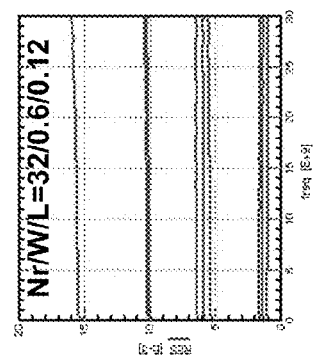

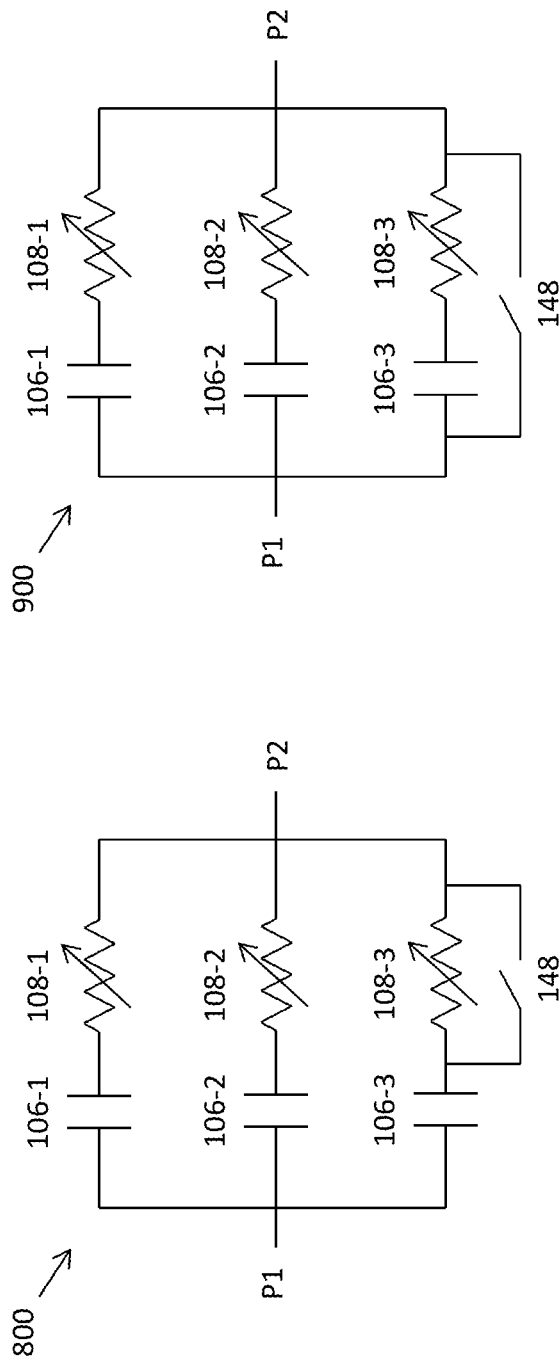

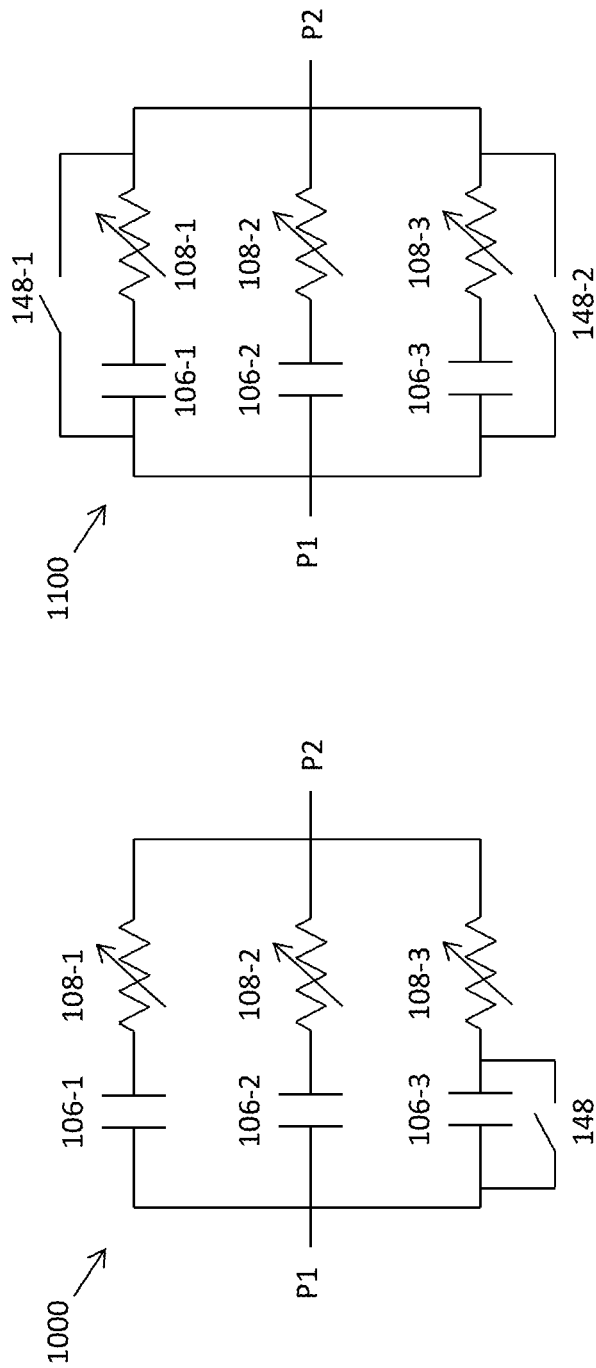

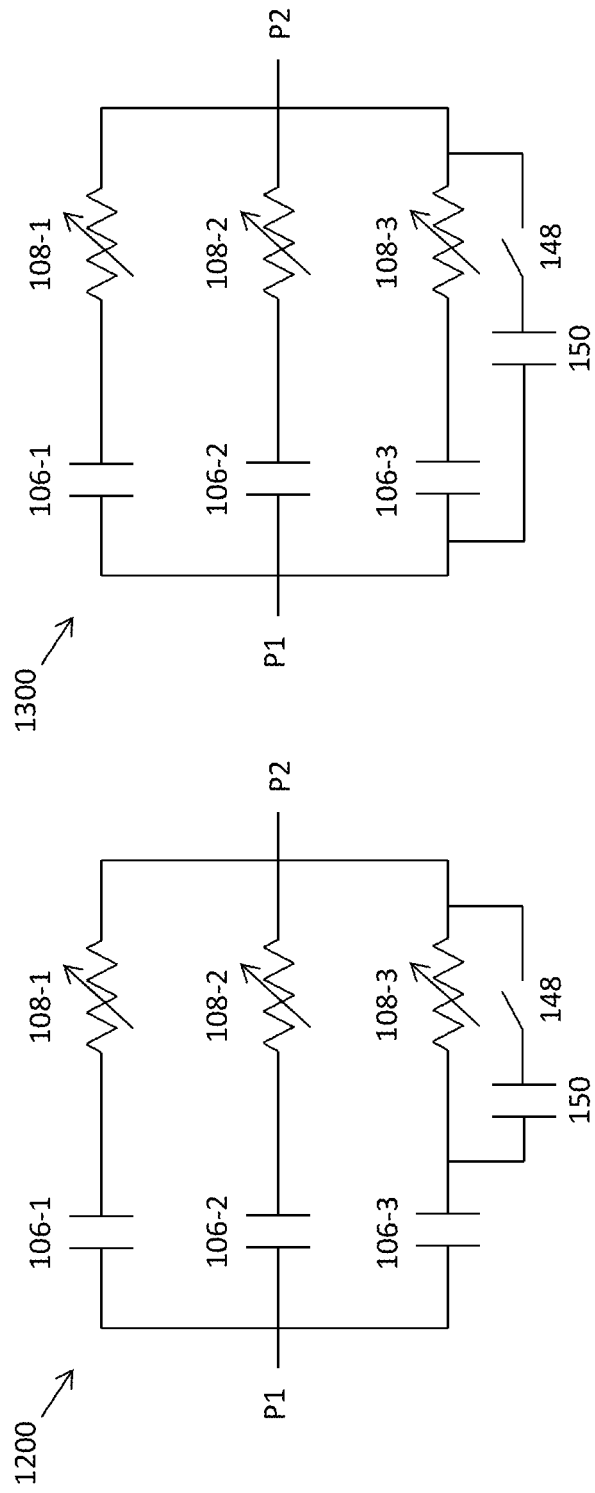

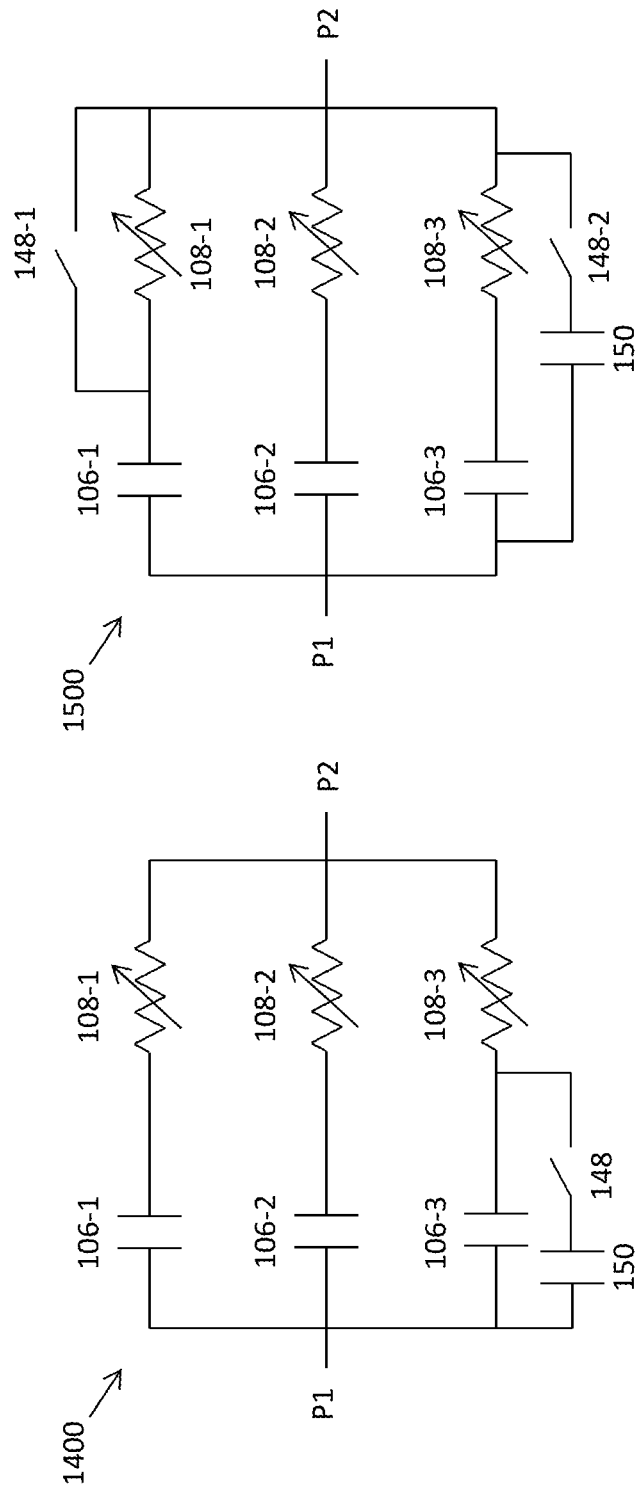

US 9,312,221 B2

VARIABLE CAPACITANCE DEVICES

FIELD OF DISCLOSURE

The disclosed system and method relate to integrated circuits. More particularly, the disclosed system and method relate to variable capacitors for integrated circuits.

BACKGROUND

Variable capacitors and varactors are widely used in integrated circuit designs. For example, such devices are commonly integrated into wireless transmitters and receivers such as cellular telephones and other mobile terminals. However, conventional varactors have low quality factors ("Q-factors") especially when implemented using advanced processing technologies.

BRIEF DESCRIPTION OF THE DRAWINGS

FIG. 3A is a circuit diagram of another example of a variable capacitance circuit in accordance with some embodiments.

FIG. 3B is a cross-sectional view of the variable capacitance circuit in accordance with the circuit illustrated in FIG. 3A taken at a first location.

FIG. 3C is a cross-sectional view of the variable capacitance circuit in accordance with the circuit illustrated in FIG. 3A taken at a second location that is different from the first location.

FIGS. 7B-7D are graphs of simulation data of the variable capacitance circuit illustrated in FIG. 7A.

FIG. 8 is a circuit diagram of an example of a variable capacitance circuit including a switched resistor in accordance with some embodiments.

FIG. 9 is a circuit diagram of one example of a variable capacitance circuit including a switch in accordance with some embodiments.

FIG. 10 is a circuit diagram of another example of a variable capacitance circuit including a switch in accordance with some embodiments.

FIG. 11 is a circuit diagram of another example of a variable capacitance circuit including a switch in accordance with some embodiments.

FIG. 12 is a circuit diagram of an example of a variable capacitance circuit including a switched capacitor in accordance with some embodiments.

FIG. 13 is a circuit diagram of another example of a variable capacitance circuit including a switched capacitor in accordance with some embodiments.

FIG. 14 is a circuit diagram of another example of a variable capacitance circuit including a switched capacitor in accordance with some embodiments.

FIG. 15 is a circuit diagram of another example of a variable capacitance circuit including a switched capacitor and another switch in accordance with some embodiments.

DETAILED DESCRIPTION

This description of the exemplary embodiments is intended to be read in connection with the accompanying drawings, which are to be considered part of the entire written description.

The disclosed devices, circuits, and methods advantageously utilize variable resistors in combination with a capacitor to change the capacitance of a variable finger capacitor. Such variable capacitance devices can be integrated into larger circuits and have higher Q-factors than conventional varactors. Additionally, the variable capacitance devices disclosed herein can be implemented with a small footprint to save valuable space on a semiconductor substrate.

Figure 1A:
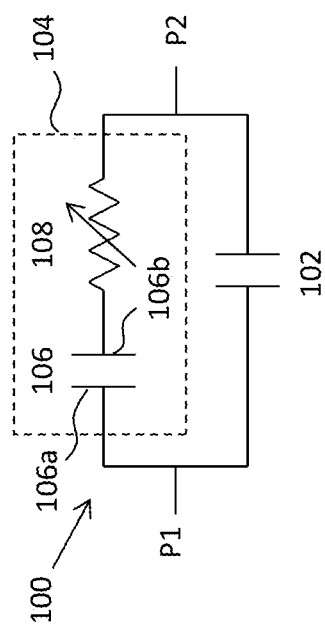
FIG. 1A is one example of a circuit diagram of a variable capacitance device in accordance with some embodiments.

FIG. 1A illustrates one example of an equivalent circuit representation of a variable capacitance device 100 in accordance with some embodiments. As shown in FIG. 1, device 100 includes a first port, P1, and a second port, P2. A capacitor 102 is disposed in parallel with a circuit element 104 comprising a capacitor 106 and a variable resistor 108 that are coupled together in series.

Figure 1B:
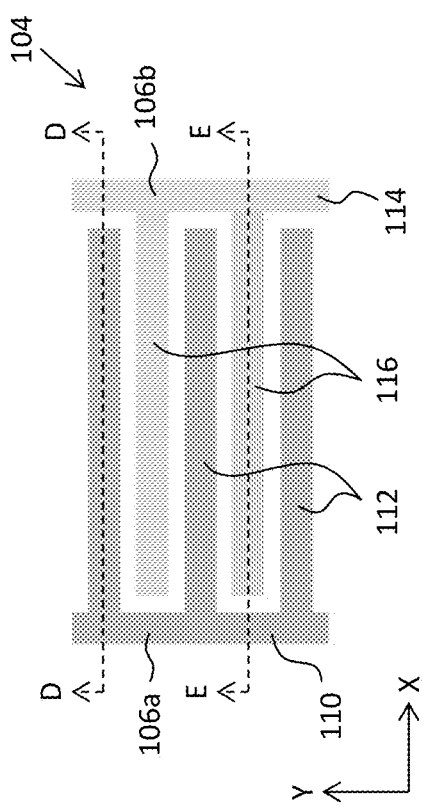
FIG. 1B is a plan view of one example of multi-finger capacitors in accordance with the variable capacitance device illustrated in FIG. 1A.

FIG. 1B illustrates one example of a plan view of a circuit element 104 of FIG. 1A. In particular, FIG. 1B is a plan view of capacitor 106 comprising a first plate 106a and a second plate 106b implemented as a metal-oxide-metal ("MOM") capacitor formed over variable resistor 108 (not shown in FIG. 1B). Plate 106a includes a segment 110 extending in a vertical direction (e.g., y-direction) across a semiconductor substrate 118 and a plurality of other segments 112 extending in the horizontal direction (e.g., x-direction) across the semiconductor substrate 118. Plate 106b includes a segment 114 extending in the vertical direction (e.g., y-direction) across semiconductor substrate 118 such that segment 114 is laterally spaced from and extends parallel to segment 110 of plate 106a. A plurality of segments 116 extend in the horizontal direction (e.g., x-direction) across semiconductor substrate 118 and are interdigitated with segments 112 of plate 106a.

Figure 1C:
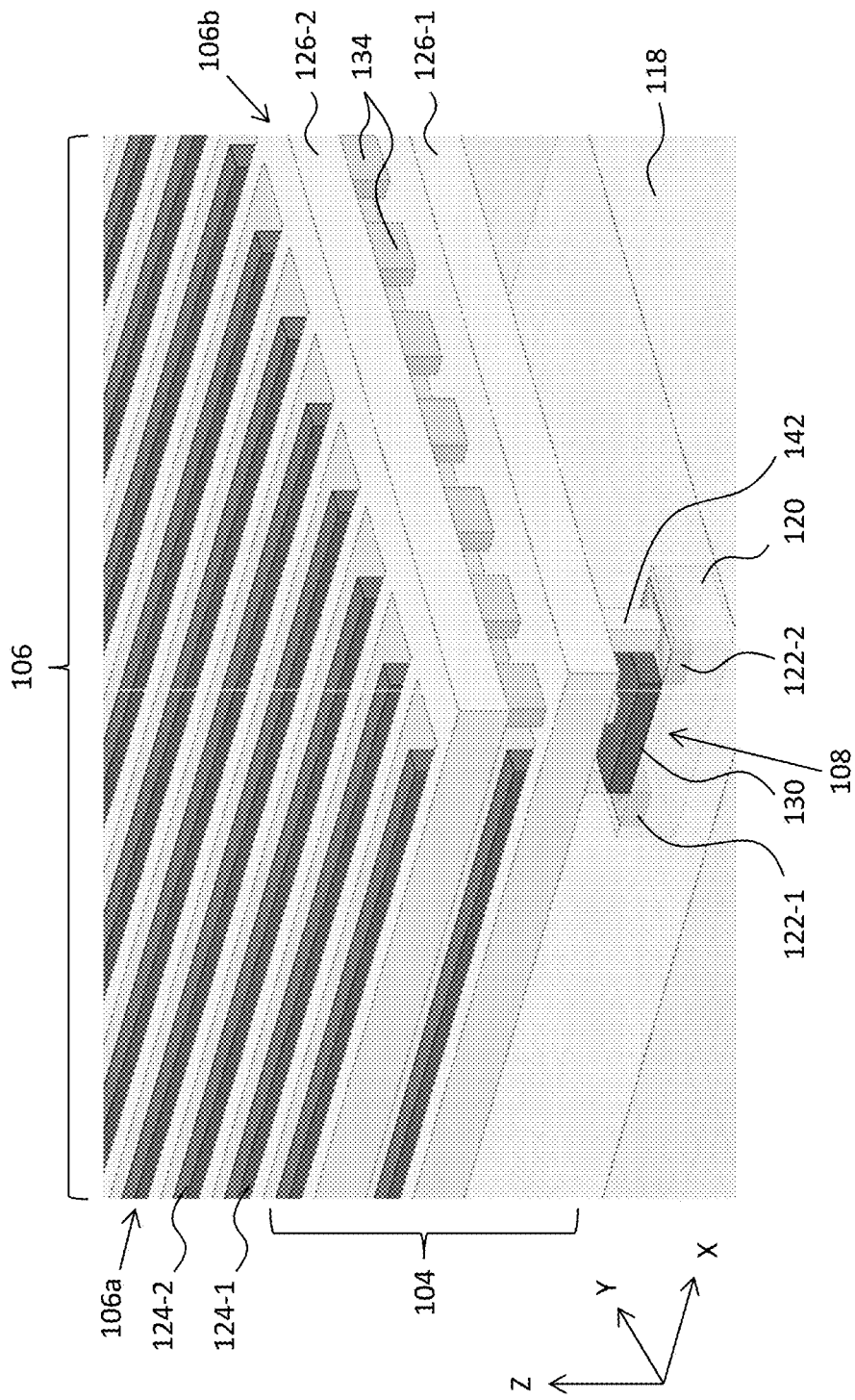
FIG. 1C is an isometric cross-sectional view of one example of a multi-finger capacitor coupled to a variable resistor formed in a semiconductor substrate in accordance with some embodiments.

Turning now to FIG. 1C, which is one example of an isometric view of the circuit element illustrated in FIG. 1B, the multi-finger capacitor 106 is shown being formed over substrate 118 in which variable resistor 108 is formed. Variable resistor 108 includes a doped well 120 that is formed in an upper surface of semiconductor substrate 118. In some embodiments, substrate 118 is a p-type substrate and well 120 is an n-well; however, one of ordinary skill in the art will understand that substrate 118 can be an n-type substrate and well 120 can be a p-well in some embodiments. Substrate 118 can be formed from a variety of materials including, but not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof.

In some embodiments, well 120 is doped with a suitable n-type material such as, for example, arsenic, phosphorus, antimony, or other Group V element. In some embodiments, well 120 is doped with a suitable p-type material including, but not limited to, boron, gallium, aluminum, or any Group III element. Contacts 122-1, 122-2 are formed in well 120 for coupling variable resistor 108 to capacitor 106. In some embodiments, are P+ doped regions or are N+ doped regions formed in the upper surface of substrate 118. Contacts 122-1, 122-2 are doped with a p-type material or an n-type material at a concentration that is different from the concentration of which substrate 118 is doped.

In some embodiments, such as the embodiment illustrated in FIG. 1C, the segments 110, 112 of plate 106a of capacitor 106 includes a plurality of conductive lines or traces 124-1, 124-2, which are disposed is different metal layers (e.g., M1, M2, M3, etc.) over the upper surface of semiconductor substrate 118. Segments 114, 116 of capacitor plate 106b also are illustrated as including a plurality of conductive lines or traces 126-1, 126-2 formed in different metal layers above the upper surface of semiconductor substrate 118. The conductive lines 126-1, 126-2 of plate 106b are coupled together by interconnects 134, which extend through one or more dielectric layers (not shown) that are disposed between the metal layers in which lines 126-1, 126-2 are disposed. A gate structure 130 is located between the upper surface of well 120 and the lower surface of conductive trace 126-1. Gate structure 130 is located directly above a channel region formed in well 120 between contacts 122-1 and 122-2 to form variable resistor 108. In some embodiments, gate structure 130 is formed from polysilicon; however, gate structure 130 can be formed from other materials including, but not limited to, Ta$_2$C, Al, copper, or other metals to list just a few possibilities.

Figure 1D:
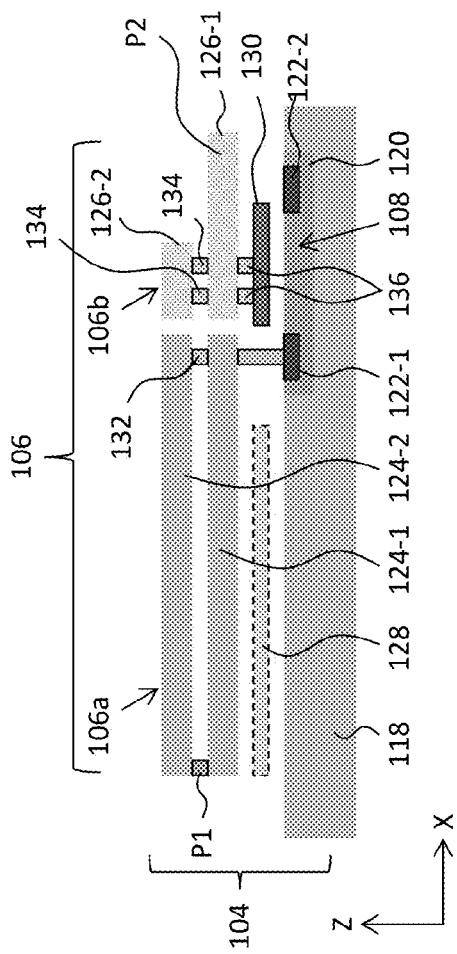
FIG. 1D is a cross-sectional view of one example of a variable capacitance circuit taken along line D-D of FIG. 1B in accordance with some embodiments.

FIG. 1D is a cross-sectional view of circuit element 104 taken along line D-D in FIG. 1B. As shown in FIG. 1D, one or more optional shielding layer 128 is disposed between the upper surface of substrate 118 and the lower surface of conductive line 124-1. In some embodiments, the one or more shielding layers 128 are formed from polysilicon; however, other materials including, but not limited to, Ta$_2$C, Al, copper, or other metals, can be used for shielding layer 128.

One or more interconnects 132 connect conductive traces 124-1, 124-2 to each other, two interconnects 134 are shown as connecting conductive traces 128-1, 128-2, and two interconnects 136 are illustrated as connecting conductive trace 128-1 to poly gate structure 130.

Although plates 106a and 106b of capacitor 106 are illustrated as including conductive traces 124, 128 in two different metal layers, respectively, capacitor 106 can be implemented with conductive trances 124, 128 being disposed in fewer metal layers or more metal layers in some embodiments.

Figure 1E:
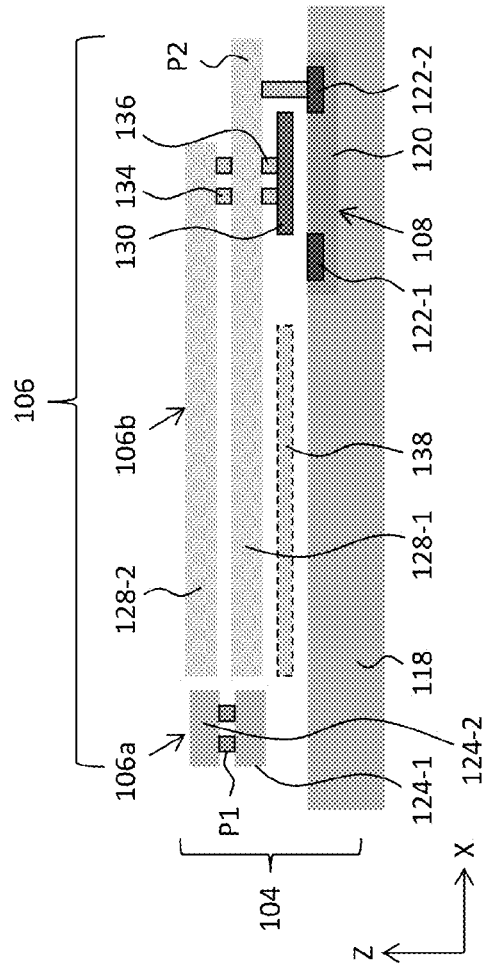
FIG. 1E is a cross-sectional view of one example of a variable capacitance circuit taken along line E-E of FIG. 1B in accordance with some embodiments.

Turning now to FIG. 1E, a poly gate structure 130 is shown as being vertically disposed (e.g., in the z-direction) between well 120 and conductive trace 128-1 of capacitor plate 106b and laterally spaced from optional poly shielding layer 138, which is formed in the same metal layer in some embodiments. Applying a bias voltage to poly gate structure 130 adjusts the resistance of variable resistor 108 by adjusting the channel resistance of well 120.

Figure 1F:
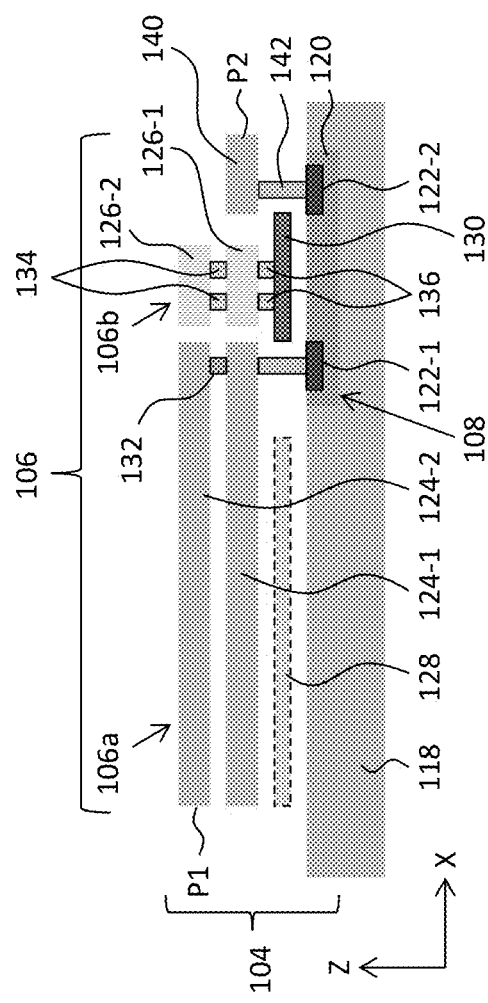
FIG. 1F is a cross-sectional view of another example of a variable capacitance circuit in accordance with some embodiments.
Figure 1G:
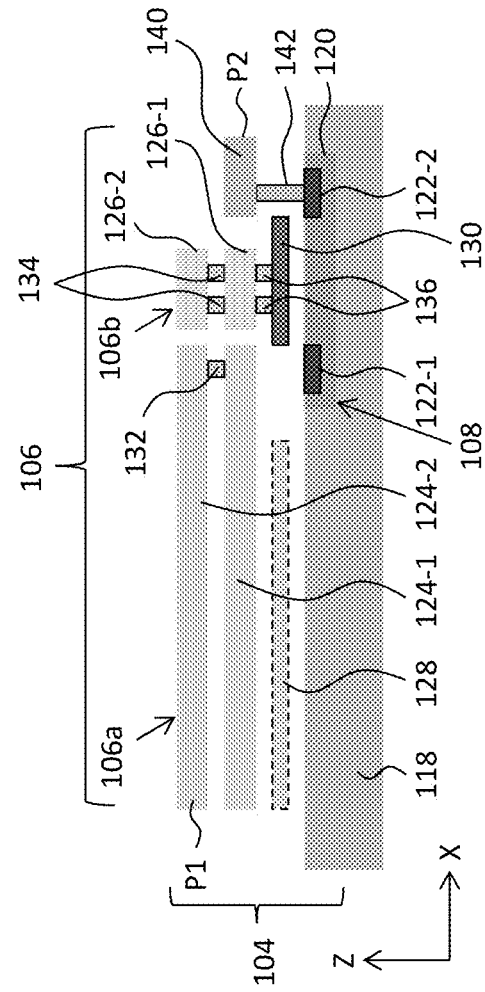
FIG. 1G is a cross-sectional view of another example of a variable capacitance circuit in accordance with some embodiments.
Figure 2A:
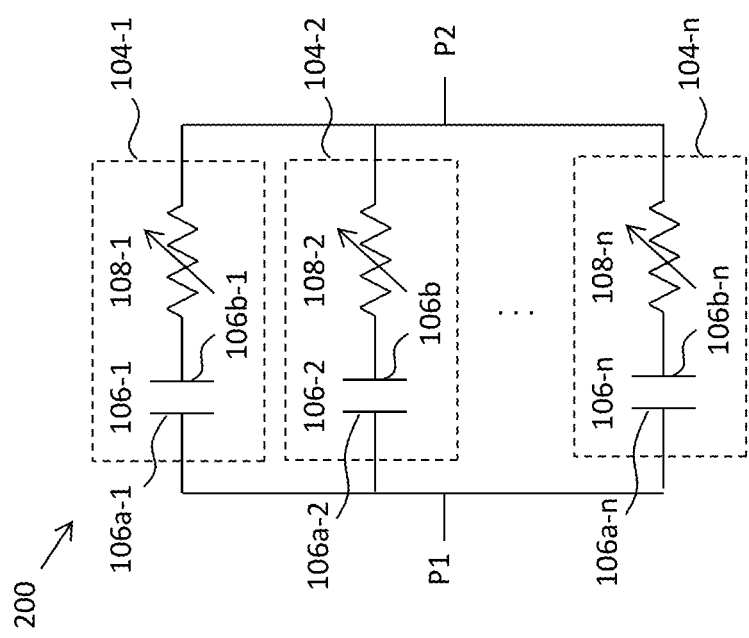
FIG. 2A is a circuit diagram of another example of a variable capacitance circuit in accordance with some embodiments.

FIGS. 1F and 1G are cross-sectional views of another implementation of a circuit element 104 in accordance with the circuit diagram illustrated in FIG. 1A and the plan view illustrated in FIG. 1B. As shown in FIG. 2A, which is a cross-sectional view taken along line D-D in FIG. 1B, a variable resistor 108 includes a doped well 120 that is formed in an upper surface of semiconductor substrate 118. In some embodiments, substrate 118 is a p-type substrate and well 120 is an n-well; however, one of ordinary skill in the art will understand that substrate 118 can be an n-type substrate and well 120 can be a p-well in some embodiments. Contacts 122-1, 122-2 are formed in well 120 for coupling variable resistor 108 to capacitor 106.

Conductive traces 124-1, 124-2 of plate 106b are formed in separate metal layers (e.g., M1, M2, M3, etc.) that are vertically stacked above substrate 118 (e.g., in the z-direction). Traces 124-1, 124-2 are shielded from substrate 118 by one or more layers of an optional shielding layer 128 and are coupled to one another by one or more interconnects 132 formed in one or more dielectric layers (not shown) that are disposed between traces 124-1, 124-2. Trace 124-2 is illustrated as serving a first port, P1, of capacitor 106. Traces 124-1, 124-2 are coupled to well 120 by a contact 122-1 and interconnect 132.

Plate 106b includes conductive traces 126-1, 126-2 that are vertically stacked (in the z-direction) above well 120. Poly gate structure 130 is disposed between the upper surface of well 120 and the lower surface of trace 126-1. Traces 126-1, 126-2 are coupled together by one or more interconnects 134, and trace 126-1 is coupled to gate structure 130 by interconnects 134. Although plates 106a and 106b of capacitor 106 are illustrated as including conductive traces 124, 126 in two different metal layers, respectively, capacitor 106 can be implemented with conductive traces 124, 126 being disposed in fewer metal layers or more metal layers in some embodiments. Another conductive trace 140, which is configured as a second port, P2, of capacitor 106, is disposed above well 120 an laterally spaced from conductive trace 126-1. Conductive trace 140 is coupled to contact 122-2 of well 120 by a interconnect 142.

FIG. 1G illustrates a cross-sectional view of another implementation of circuit element 104 taken along line D-D in FIG. 1B. As shown in FIG. 1G, plate 106a of capacitor 106 includes a pair of conductive traces 124-1, 124-2 that are vertically stacked in the z-direction above substrate 118. An optional isolation layer 128 is disposed vertically above the upper surface of substrate 118 and vertically below the lower surface of conductive trace 124-1. Traces 124-1, 124-2 are coupled together by interconnect 132, but are not directly connected to variable resistor 108.

Variable resistor 108 is formed in the upper surface of substrate 108 and includes contacts 122-1, 122-2 that are laterally spaced from one another in doped well 120. Gate structure 130 is disposed vertically above well 120 and is coupled directly to conductive traces 126-1, 126-2 of capacitor plate 106*b* by interconnects 134, 136. For example, gate structure 130 is coupled to conductive trace 126-1 by interconnect 136, and conductive trace 126-1 is coupled to conductive trace 126-2 by interconnect 134. Conductive trace 140, which is configured as a second port, P2, of capacitor 106, is disposed above well 120 and laterally spaced from conductive trace 126-1. Conductive trace 140 is coupled to contact 122-2 of well 120 by an interconnect 142. Although conductive trace 140 is shown as being disposed in the same metal layer as trace 126-1, conductive trace 140 can be disposed in other metal layers including the metal layer in which conductive trace 126-2 is disposed.

FIG. 2A illustrates an embodiment of a circuit 200 including a number, n, of circuit elements 104, i.e., circuit elements 104-1, 104-2, ..., 104-*n* (collectively "circuit elements 104"), where the number n is an integer is greater than or equal to one, are disposed in parallel with each other. Each of the circuit elements 104 includes a capacitor 106 coupled in series with a variable resistor 108.

Figure 2B:
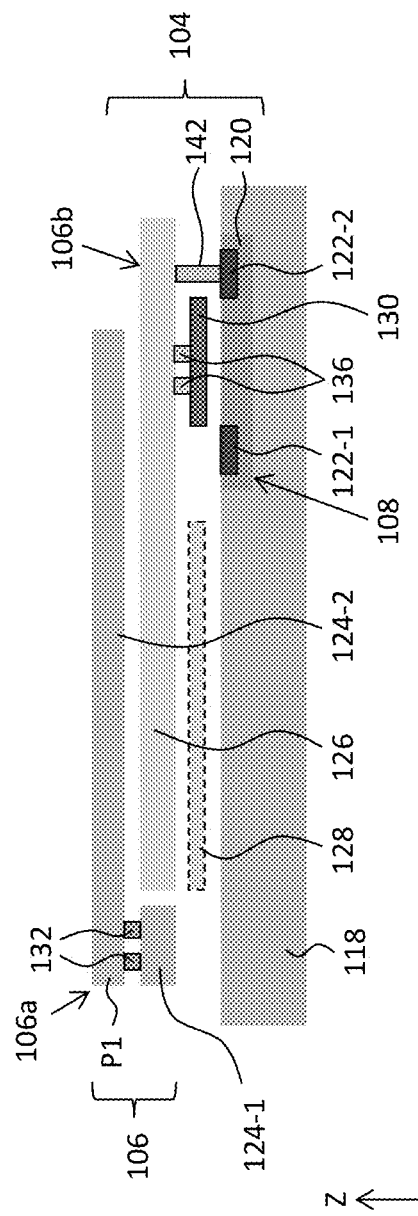
FIG. 2B is a cross-sectional view of another example of a variable capacitance circuit in accordance with some embodiments.

FIG. 2B illustrates a cross-sectional view of another example of a capacitive circuit element 104 including a variable resistor 108. In FIG. 2B, capacitor 106 includes a first plate 106*a* with conductive traces 124-1, 124-2 that are disposed in separate metal layers and are coupled together by one or more interconnects 132. In some embodiments, conductive trace 124-1 has a lateral length (e.g., in the x-direction) that is less than a lateral length of conductive trace 124-2; however, it is possible for conductive trace 124-2 to have a lateral length that is greater than or equal to conductive trace 124-1.

Capacitor plate 106*b* includes a single conductive trace 126, which is illustrated as being disposed in the same metal layer as conductive trace 124-1. In some embodiments, conductive trace 126 is disposed in the same metal layer as conductive trace 124-2. As shown in FIG. 2, a substantial lateral length (e.g., more than half of the length in the x-direction) of conductive trace 126 is disposed directly beneath (in the z-direction) conductive trace 124-2 to form capacitor 106.

Variable resistor 108 includes a doped well 120 formed in the upper surface of substrate 118. Contacts 122-1, 122-2 are formed in well 120 for coupling variable resistor 120 to plate 106*b* of capacitor 106 by interconnect 142. The resistance of variable resistor 108 is adjusted by applying a voltage to gate structure 130, which is disposed between the upper surface of substrate 118 and the lower surface of conductive trace 126. Gate structure 130 is coupled to conductive trace 126 by one or more interconnects 136. One or more optional isolation layers 128 are disposed between an upper surface of substrate 118 and a lower surface of conductive trace 126. In some embodiments, the one or more isolation layers 128 are disposed adjacent to gate structure 130 such that isolation layers 128 are not disposed directly above well 120.

FIGS. 3A-3C illustrate another example of a capacitive circuit 300. Referring first to FIG. 3A, circuit 300 includes a three capacitors 106-1, 106-2, 106-3 disposed in parallel with each other between ports P1 and P2. A first variable resistor 108-1 is coupled to capacitors 106-1, 106-2 and to variable resistor 108-2, which is coupled to capacitors 106-2, 106-3.

FIGS. 3B and 3C illustrate one example of different cross-sectional views of the circuit 300 illustrated in FIG. 300 when implemented as interdigitated multi-finger capacitors 106-1, 106-2, 106-3 formed on different metal layers. For example, each capacitor 106-1, 106-2, 106-3 is formed on a different metal layer with each respective plate (e.g., 106-1*a*, 106-1*b*, 106-2*a*, 106-2*b*, 106-3*a*, 106-3*b*) includes a segment extending in the y-direction (e.g., segments 110, 114 illustrated in FIG. 1B) and a plurality of segments extending in the x-direction (e.g., segments 112, 116 illustrated in FIG. 1B).

Referring now to FIG. 3B, capacitor 106-1 includes conductive trace(s) 124-1 formed in a first metal layer to provide plate 106-1*a*, and capacitor 106-2 includes conductive trace(s) 126-1 formed in a second metal layer that is vertically disposed above trace 124-1 to provide plate 106-2*a*. Capacitor 106-3 includes conductive trace(s) 144-1 formed in a third metal layer that is vertically disposed above trace(s) 126-1 to provide plate 106-3*a*.

Trace 124-1 of plate 106-1*a* is coupled to contact 122-3, which is formed in the upper surface of well 120 that is formed in the upper surface of substrate 118. Trace 126-1 of plate 106-2*a* is coupled to contact 122-2, which is laterally spaced from contacts 122-1 and 122-3, by interconnects 142 and trace 124-2. Trace 124-2 is disposed in the same metal layer as trace 124-1 and is laterally spaced from trace 124-1. Trace 144-1 of plate 106-3*a* is coupled to contact 122-1 through interconnects 142, trace 126-2, and trace 124-3. Trace 126-2 is disposed in the same metal layer as trace 126-1, but is laterally spaced from trace 126-1, and trace 124-3 is disposed in the same metal layer as traces 124-1, 124-2, but is laterally spaced from these traces.

Variable capacitors 108-1 and 108-2 are formed between contacts 122-1, 122-2, 122-3 in the upper surface of well 120. For example, first and second gate structures 130-1 and 130-2 are disposed above respective channel regions for forming variable transistors 108-1, 108-2, respectively. Gate structure 130-1 is disposed directly above a channel region that is located in the upper surface of doped well 120 between contact 122-2 and contact 122-3, and gate structure 130-2 is disposed directly above a channel region that is located in the upper surface of doped well 120 between contact 122-1 and contact 122-3.

FIG. 3C illustrates the second plates 106-1*b*, 106-2*b*, 106-3*b* being laterally spaced from traces 124-3, 126-2, 144-1 of plate 106-3*a*. Capacitor 106-1 includes conductive trace(s) 124-4 formed in a first metal layer to provide plate 106-1*b*, and capacitor 106-2 includes conductive trace(s) 126-3 formed in a second metal layer that is vertically disposed above trace 124-4 to provide plate 106-2*b*. Capacitor 106-3 includes conductive trace(s) 144-2 formed in a third metal layer that is vertically disposed above trace(s) 126-3 to provide plate 106-3*b*

Figure 3D:
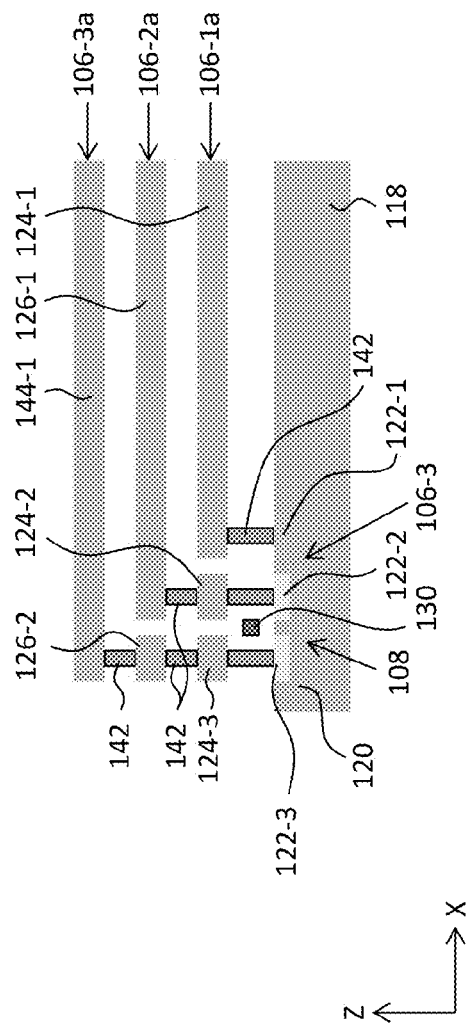
FIG. 3D is a cross-sectional view of another example of a variable capacitance circuit in accordance with some embodiments.

FIG. 3D is a cross-sectional view of capacitive device including a junction capacitor. Junction capacitor 106-4 is formed between doped well 120, which is formed in the upper surface of semiconductor substrate 118, and contact 122-1, which is also formed in the upper surface of semiconductor substrate 118. As shown in FIG. 3D, contact 122-1 is laterally spaced from well 120 and is not formed in well 120 like contacts 122-2 and 122-3, which are formed in the upper surface of well 120.

Junction capacitor 106-4 is disposed in series with capacitors 106-1 and 106-2, which are two of the other three capacitors 106-1, 106-2, 106-3 illustrated in FIG. 3D. Capacitors 106-1, 106-2, 106-3 are multi-finger capacitors formed by the conductive traces disposed in the metal layers above substrate 118 like capacitors 106-1, 106-2, 106-3 illustrated in FIG. 3C.

For example, capacitor 106-1 includes conductive trace(s) 124-1 formed in a first metal layer to provide plate 106-1*a*, and capacitor 106-2 includes conductive trace(s) 126-1 formed in a second metal layer that is vertically disposed above trace 124-1 to provide plate 106-2*a*. Capacitor 106-3 includes conductive trace(s) 144-1 formed in a third metal layer that is vertically disposed above trace(s) 126-1 to provide plate 106-3*a*.

Trace 124-1 of plate 106-1*a* is coupled to contact 122-3, which is formed in the upper surface of well 120 that is formed in the upper surface of substrate 118. Trace 126-1 of plate 106-2*a* is coupled to contact 122-2, which is laterally spaced from contacts 122-1 and 122-3, by interconnects 142 and trace 124-2. Trace 124-2 is disposed in the same metal layer as trace 124-1 and is laterally spaced from trace 124-1. Trace 144-1 of plate 106-3*a* is coupled to contact 122-1 through interconnects 142, trace 126-2, and trace 124-3. Trace 126-2 is disposed in the same metal layer as trace 126-1, but is laterally spaced from trace 126-1, and trace 124-3 is disposed in the same metal layer as traces 124-1, 124-2, but is laterally spaced from these traces. The second plates 106-1*b*, 106-2*b*, and 106-3*b* are not shown in FIG. 3D.

The capacitive device illustrated in FIG. 3D also includes a variable resistor 108, which is formed in well 120. For example, a gate structure 130 is disposed directly above a channel region that is formed in the upper surface of well 120 between contacts 122-2 and 122-3. As described above, the resistance of variable resistor 108 is adjusted by adjusting a voltage applied to contact 130, which changes the resistance of the channel region.

Figure 3E:
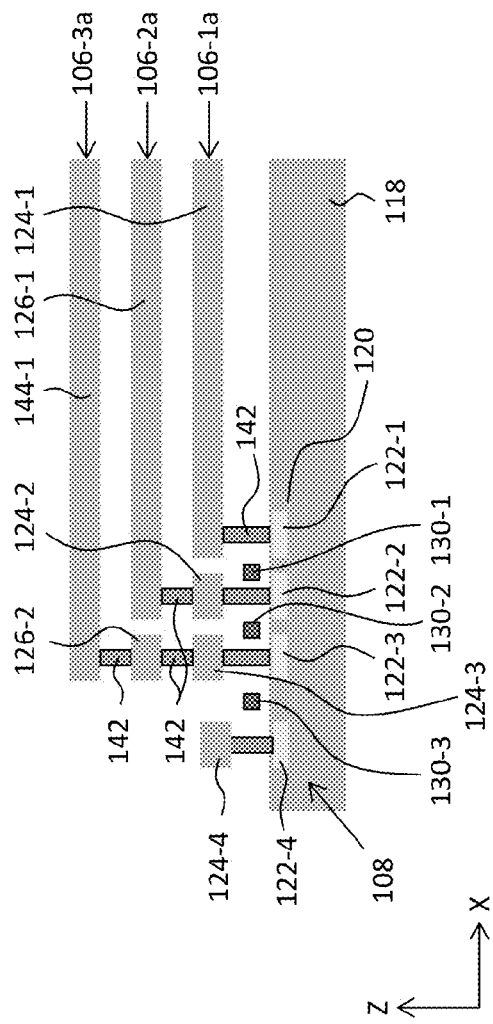
FIG. 3E is a cross-sectional view of another example of a variable capacitance circuit in accordance with some embodiments.

Turning now to FIG. 3E, another example of a conductive device in accordance with some embodiments is illustrated. The illustrated conductive structure includes a plurality of capacitors 106-1, 106-2, 106-3, a plurality of variable resistors 108-1, 108-2, and 108-3 (identified as "108" in FIG. 3E), and a biasing contact 124-4.

In some embodiments, capacitors 106-1, 106-2, 106-3 are multi-finger capacitors formed by the conductive traces disposed in the metal layers above substrate 118. For example, capacitor 106-1 includes conductive trace(s) 124-1 formed in a first metal layer to provide plate 106-1*a*, and capacitor 106-2 includes conductive trace(s) 126-1 formed in a second metal layer that is vertically disposed above trace 124-1 to provide plate 106-2*a*. Capacitor 106-3 includes conductive trace(s) 144-1 formed in a third metal layer that is vertically disposed above trace(s) 126-1 to provide plate 106-3*a*.

Trace 124-1 of plate 106-1*a* is coupled to contact 122-3, which is formed in the upper surface of well 120 that is formed in the upper surface of substrate 118. Trace 126-1 of plate 106-2*a* is coupled to contact 122-2, which is laterally spaced from contacts 122-1 and 122-3, by interconnects 142 and trace 124-2. Trace 124-2 is disposed in the same metal layer as trace 124-1 and is laterally spaced from trace 124-1. Trace 144-1 of plate 106-3*a* is coupled to contact 122-1 through interconnects 142, trace 126-2, and trace 124-3. Trace 126-2 is disposed in the same metal layer as trace 126-1, but is laterally spaced from trace 126-1, and trace 124-3 is disposed in the same metal layer as traces 124-1, 124-2, but is laterally spaced from these traces. The second plates 106-1*b*, 106-2*b*, and 106-3*b* are not shown in FIG. 3E.

Contacts 122-1, 122-2, 122-3, 122-4 are disposed in the upper surface of doped well 120, which is formed in the upper surface of substrate 118. Gate structures 130-1, 130-2, 130-3 are disposed between the upper surface of well 120 and the lower surfaces of the conductive traces 124, 126-1, and 144-1, 1, which are disposed in the same metal layer. Each gate structure 130-1, 130-2, 130-3 is located directly above a respective channel region in well 120. Each channel region is located between a pair of contacts 122. For example, gate structure 130-1 is disposed above a channel region that is located in the upper surface of well 120 between contacts 122-1 and 122-2 to form a first variable resistor 108-1. Gate structure 130-2 is disposed above a channel region that is located in the upper surface of well 120 between contacts 122-2 and 122-3 to form a second variable resistor 108-2, and gate structure 130-3 is disposed above a channel region that is located in the upper surface of well 120 between contacts 122-3 and 122-4 to form a third variable resistor 108-3.

In some embodiments, biasing contact 124-4 is disposed in the same metal layer as one or more of the conductive traces for capacitors 106. As shown in FIG. 3E, for example, biasing contact 124-4 is disposed in the same metal layer as conductive traces 124-1, 124-2, and 124-3. Biasing contact 124-4 is coupled to contact 122-4 formed in the upper surface of well 120 by interconnect 142 and is configured to operate as a switch by coupling biasing contact to a voltage at, above, or below ground potential. For example, gate structure 130 functions as the gate for the channel formed in well 120. If gate structure 130 is biased to VDD, then the channel will be induced in the well 120.

Figure 3F:
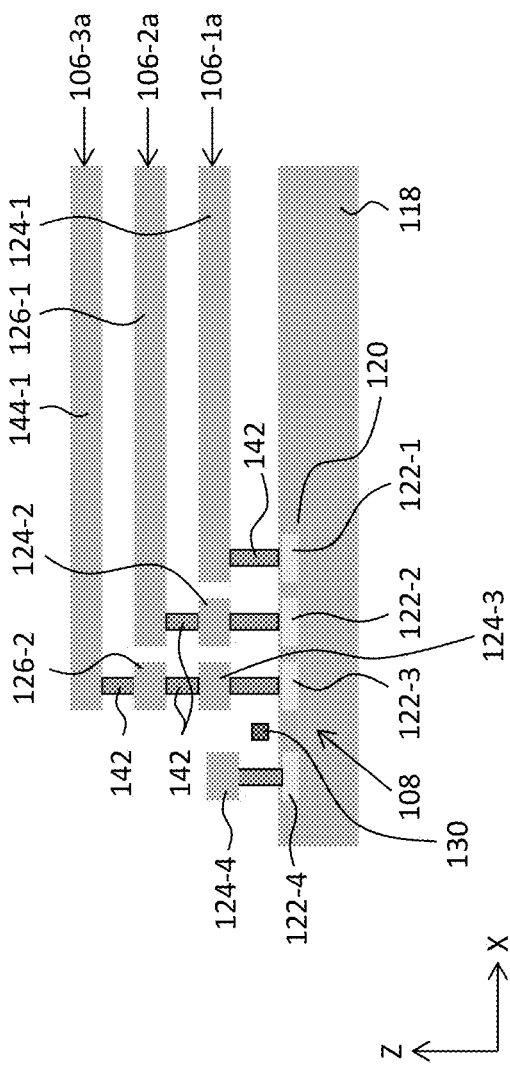
FIG. 3F is a cross-sectional view of another example of a variable capacitance circuit in accordance with some embodiments.

FIG. 3F illustrates another embodiment of a conductive device including a biasing contact. As illustrated in FIG. 3F, the illustrated conductive structure includes a plurality of capacitors 106-1, 106-2, 106-3, a single variable resistor 108, and a biasing contact 124-4 all of which are formed in, on, or over substrate 118.

In some embodiments, capacitors 106-1, 106-2, 106-3 are multi-finger capacitors formed by the conductive traces disposed in the metal layers (e.g., M1, M2, M3, etc.) above substrate 118. For example, capacitor 106-1 includes conductive trace(s) 124-1 formed in a first metal layer to provide plate 106-1*a*, and capacitor 106-2 includes conductive trace(s) 126-1 formed in a second metal layer that is vertically disposed above trace 124-1 to provide plate 106-2*a*. Capacitor 106-3 includes conductive trace(s) 144-1 formed in a third metal layer that is vertically disposed above trace(s) 126-1 to provide plate 106-3*a*.

Trace 124-1 of plate 106-1*a* is coupled to contact 122-3, which is formed in the upper surface of well 120 that is formed in the upper surface of substrate 118. Trace 126-1 of plate 106-2*a* is coupled to contact 122-2, which is laterally spaced from contacts 122-1 and 122-3, by interconnects 142 and trace 124-2. Trace 124-2 is disposed in the same metal layer as trace 124-1 and is laterally spaced from trace 124-1. Trace 144-1 of plate 106-3*a* is coupled to contact 122-1 through interconnects 142, trace 126-2, and trace 124-3. Trace 126-2 is disposed in the same metal layer as trace 126-1, but is laterally spaced from trace 126-1, and trace 124-3 is disposed in the same metal layer as traces 124-1, 124-2, but is laterally spaced from these traces. The second plates 106-1*b*, 106-2*b*, and 106-3*b* are not shown in FIG. 3F.

Plate 106-1*a* is coupled to contact 122-1 by interconnect 122-1, and conductive plate 106-2*a* is coupled to contact 122-2 through interconnects 142 and conductive trace 124-2, which is disposed in the same metal layer as conductive trace 124-1. Plate 106-3*a* is coupled to contact 122-3 by interconnects 142, conductive trace 126-2, and conductive trace 124-3. Conductive trace 126-2 is disposed in the same metal layer as conductive trace 126-1, and conductive trace 124-3 is disposed I the same metal layer as conductive traces 124-1 and 124-2. Biasing contact 124-4 is disposed in the same metal layer as conductive traces 124-1, 124-2, 124-3, and 124-3. In some embodiments, biasing contact 124-4 is disposed in a different metal layer.

Contacts 122 (i.e., contacts 122-1, 122-2, 122-3, and 122-4) are disposed in the upper surface of doped well 120 that is formed in the upper surface of substrate 118. A single gate structure 130 is located between the upper surface of well 120 and the lower surfaces of the conductive traces 124-1, 124-2, 124-3, and 124-4, which are disposed in the same metal layer. Gate structure 130 is located directly above a channel region formed in well 120 between contacts 122-3 and 122-4 to form a variable resistor 108.

Figure 4:
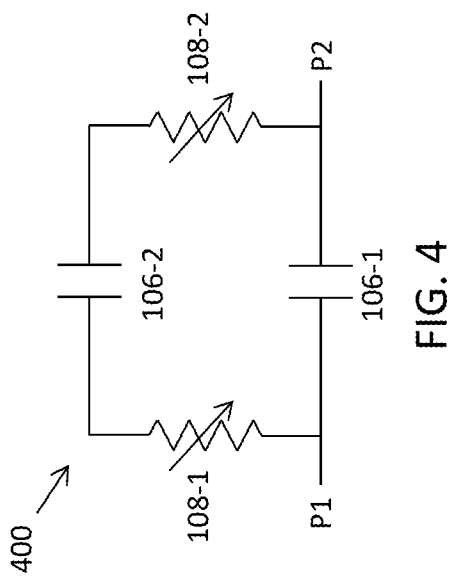
FIG. 4 is a circuit diagram of another example of a variable capacitance circuit in accordance with some embodiments.

As mentioned above, the variable capacitance devices can have a variety of configurations and equivalent circuit representations. For example, FIG. 4 illustrates another example of an equivalent circuit representation of a variable capacitance device 400 in accordance with some embodiments. As shown in FIG. 4, variable capacitance device 400 includes a first port, P1, to which a variable resistor 108-1 and a variable capacitor 106-1 are coupled in parallel with each other. A second capacitor 106-2 is disposed in series with variable resistor 108-1 and a second variable resistor 108-2, which is disposed in parallel with capacitor 106-1. A second port, P2, of circuit 400 is coupled to capacitor 106-1 and to variable resistor 108-2.

Figure 5:
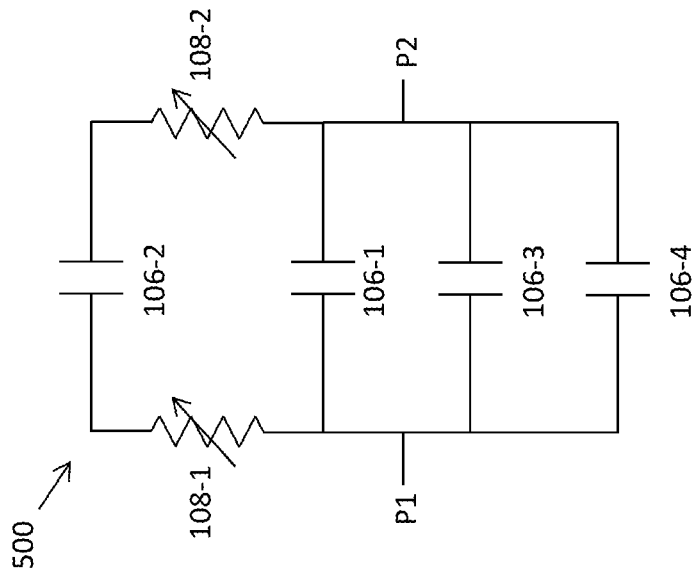
FIG. 5 is a circuit diagram of another example of a variable capacitance circuit in accordance with some embodiments.

FIG. 5 illustrates yet another example of a variable capacitance circuit 500 in accordance with some embodiments. Circuit 500 includes a first port, P1, that is coupled to a variable resistor 108-1 and capacitors 106-1, 106-3, and 106-4 that are all disposed in parallel with one another. Variable resistor 108-1 is coupled to capacitor 106-2, which is coupled to variable resistor 108-2. Variable resistor 108-2 is coupled to a second port, P2, of circuit 500, which is also coupled to capacitor 106-1, 106-3, and 106-4.

Figure 6:
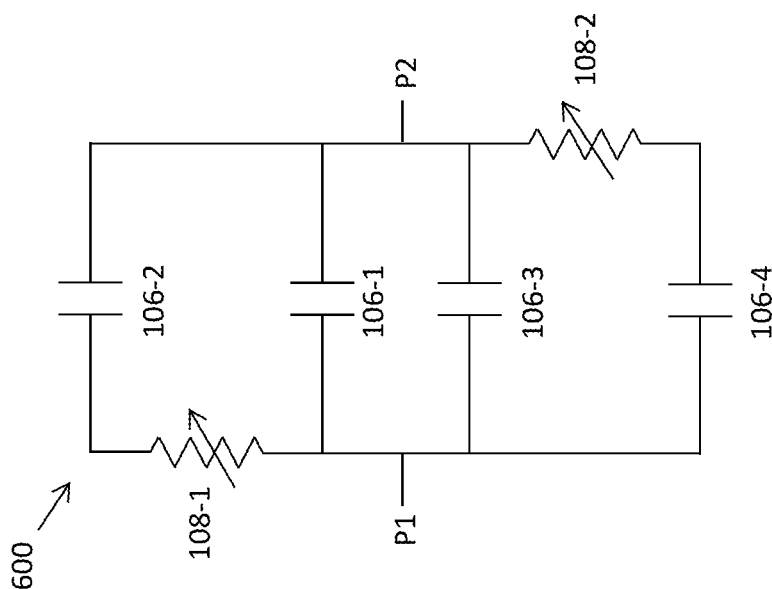
FIG. 6 is a circuit diagram of another example of a variable capacitance circuit in accordance with some embodiments.

FIG. 6 illustrates another example of a variable capacitance circuit 600 in accordance with some embodiments. Circuit 600 includes first and second ports, P1 and P2, with port P1 being coupled to variable resistor 108-1 and capacitors 106-1, 106-3, 106-4, which are disposed in parallel with one another. Variable resistor 108-1 is coupled in series with capacitor 106-2, and capacitor 106-4 is coupled in series with variable resistor 108-2. Port P2 is coupled to capacitors 106-1, 106-2, 106-3 and to variable resistor 108-2. Although four capacitors 106 and two variable resistors 108-2 are illustrated, fewer or more of each device can be implemented.

Figure 7A:
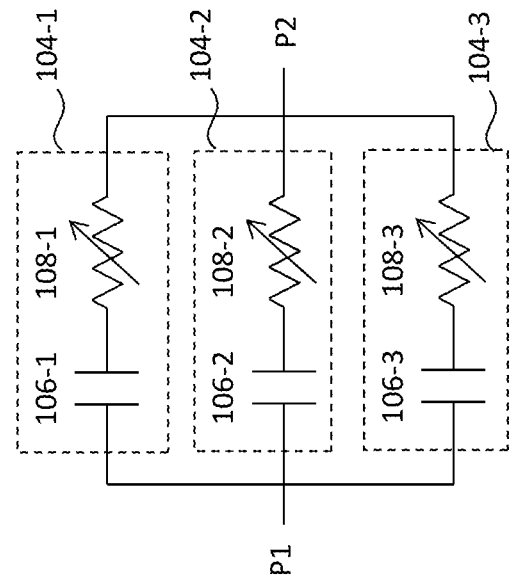
FIG. 7A is a circuit diagram of another example of a variable capacitance circuit in accordance with some embodiments.
Figure 7B:
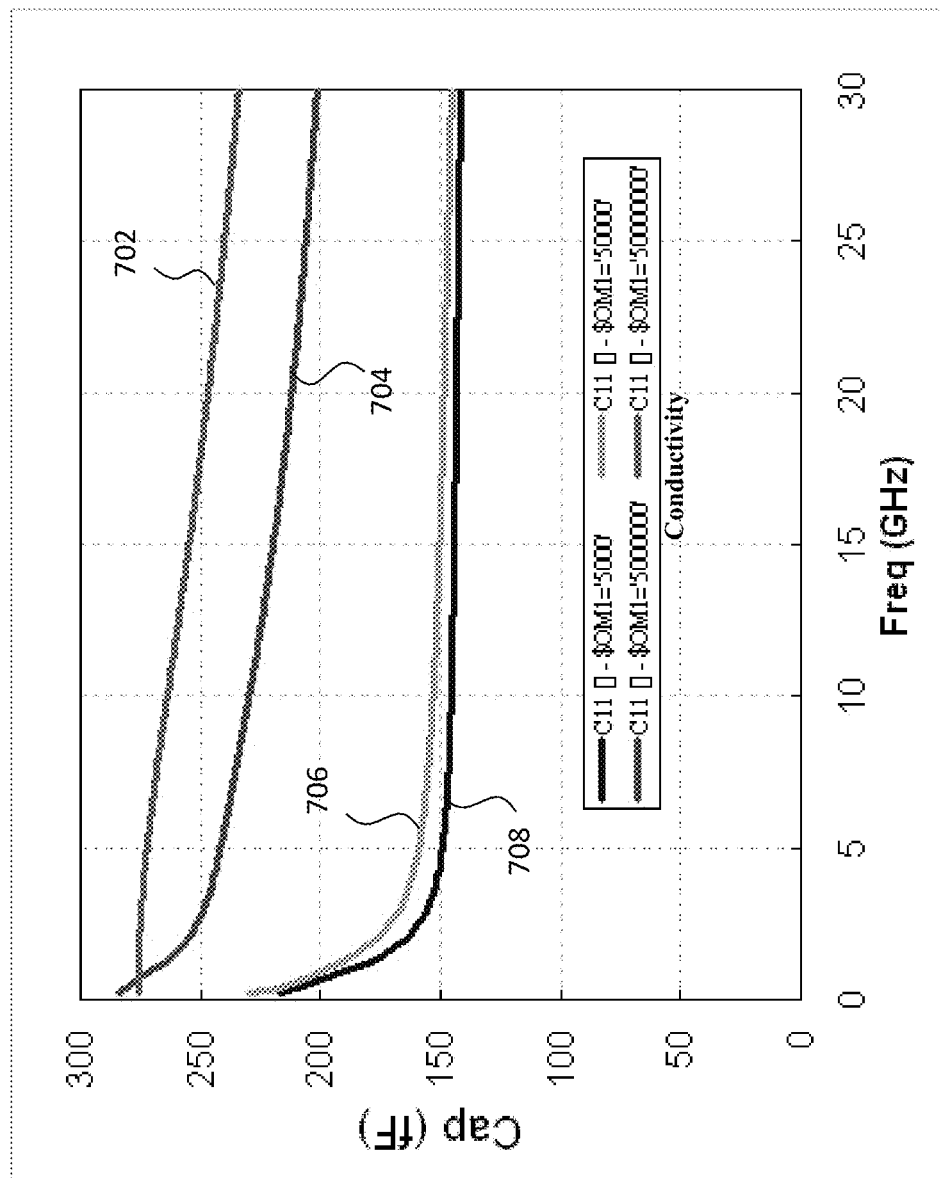

FIGS. 7B-7D illustrate simulation results of a capacitive device having the equivalent circuit representation as illustrated in FIG. 7A. As shown in FIG. 7A, the circuit includes three circuit elements 104-1, 104-2, 104-3 each including a respective capacitor 106-1, 106-2, 106-3 disposed in series with a variable resistor 108-1, 108-2, 108-3. As simulated, the resistance of variable resistor 108-1 was ten times the resistance of resistor 108-2 and 100 times the resistance of resistor 108-2. In FIGS. 7B and 7C, trace 702 is for a resistances of 2 kΩ, trace 704 corresponds to a resistance of 2Ω, trace 706 corresponds to a resistance of 200Ω, and trace 708 corresponds to a resistance of 0.2Ω.

The variable capacitance circuits can also include switches for adjusting the capacitance of the circuit. For example, FIG. 8 illustrates one example of a circuit 800 in which a switch 148 is disposed in parallel with variable capacitor 108-3. Circuit 800 includes a first capacitor 106-1 disposed in series with a first variable capacitor 108-1. A second capacitor 106-2 and variable resistor 108-2 are disposed in series with each other and in parallel with capacitor 106-1 and variable resistor 108-1. A third capacitor 106-3 is disposed in parallel with capacitors 106-1, 106-2 and variable resistors 108-1, 108-2 and is disposed in series with a parallel combination of variable resistor 108-3 and switch 148. As described in greater detail above, each variable resistance device 108-1, 108-2, 108-3 includes a channel region formed in a semiconductor substrate over which a gate structure is formed such that the resistance of the channel is adjusted based on the voltage applied to the gate structure.

FIG. 9 illustrates another example of a circuit 900 configured with a switch 148. Circuit 900 includes a first capacitor 106-1 that is coupled in series with variable resistor 108-1 and is coupled to capacitors 106-2, 106-3 and to switch 148. Variable resistor 108-1 is coupled to variable switches 108-2 and 108-3 and to switch 148. Capacitor 106-2 is disposed in series with variable resistor 108-2. Switch 148 is disposed in parallel with the series combination of capacitor 106-3 and variable resistor 108-3. Each variable resistor 108-1, 108-2, 108-3 includes a channel region formed in a semiconductor substrate over which a gate structure is formed such that the resistance of the channel is adjusted based on the voltage applied to the gate structure.

FIG. 10 illustrates another example of a circuit 900 configured with a switch 148. Circuit 1000 includes a first capacitor 106-1 that is coupled in series with variable resistor 108-1 and is coupled to capacitors 106-2, 106-3 and to switch 148. Variable resistor 108-1 is coupled to variable switches 108-2 and 108-3. Capacitor 106-2 is disposed in series with variable resistor 108-2. Switch 148 is disposed in parallel with capacitor 106-3 and in series with variable resistor 108-3. In some embodiments, each variable resistor 108-1, 108-2, 108-3 of circuit 900 includes a channel region formed in a semiconductor substrate over which a gate structure is formed such that the resistance of the channel is adjusted based on the voltage applied to the gate structure.

The number of switches that can be included in a variable capacitance circuit can be greater than one. For example, FIG. 11 illustrates one example of a circuit 1100 that includes a pair of switches 148-1, 148-2. A first switch is disposed in parallel with capacitor 106-1 and adjustable resistor 108-1 that are coupled together in series. Capacitor 106-2 is coupled in series with adjustable resistor 108-2 such that capacitor 106-2 and adjustable resistor 108-2 are disposed in parallel with capacitor 106-1 and adjustable resistor 108-1. Capacitor 106-3 is coupled in series with adjustable resistor 108-3. A second switch 148-2 is disposed in parallel with the combination of capacitor 106-3 and adjustable resistor 108-3. In some embodiments, each of the variable resistors 108-1, 108-2, 108-3 of circuit 110 includes a channel region formed in a semiconductor substrate over which a gate structure is formed. Adjusting the voltage applied to the gate structure adjusts the resistance of the channel region and the variable resistor.

FIG. 12 illustrates another example of a variable capacitance circuit 1200 in accordance with some embodiments. Circuit 1200 includes capacitors 106-1, 106-2, 106-3 that are coupled together in parallel with each capacitor 106-1, 106-2, 106-3 being coupled in series with a respective variable resistor 108-1, 108-2, 108-3. A switched capacitor element comprising a capacitor 150 disposed in series with a switch is disposed in parallel with variable resistor 108-3. In particular, capacitor 150 is coupled to a node 152 disposed between capacitor 106-3 and variable resistor 108-3, and switch 148 is coupled to port P2. In some embodiments, each variable resistor 108-1, 108-2, 108-3 of circuit 1200 includes a channel region formed in a semiconductor substrate over which a gate structure is formed such that the resistance of the channel is adjusted based on the voltage applied to the gate structure.

FIG. 13 illustrates another example of a variable capacitance circuit 1300 including a switched capacitor element. In the embodiment illustrated in FIG. 13, switched capacitor element includes a capacitor 150 coupled in series with switch 148. The switched capacitor element is disposed in parallel with the other with capacitors 106-1, 106-2, 106-3 each of which is disposed in series with a respective variable resistor 108-1, 108-2, 108-3. As described above, each of the variable resistors 108-1, 108-2, 108-3 includes a channel region formed in a semiconductor substrate over which a gate structure is formed. The resistance of the variable resistor is based, at least in part, on the voltage applied to the gate structure, which adjusts the resistance of the respective channel region.

FIG. 14 illustrates another example of a variable capacitance circuit 1400 configured with a switched capacitor element. Circuit 1400 includes capacitors 106-1, 106-2, 106-3 coupled to a port P1 and disposed in parallel with one another. Each capacitor 106-1, 106-2, 106-3 is coupled in series with a respective variable resistor 108-1, 108-2, 108-3. Variable resistors 108-1, 108-2, 108-3 are coupled together and to port P2 and each includes a channel region formed in a semiconductor substrate over which a gate structure is formed such that the resistance of the channel is adjusted based on the voltage applied to the gate structure. A switched capacitor device comprising a capacitor 150 disposed in series with a switch 148 is disposed in parallel with capacitor 106-3. For example, capacitor 150 is coupled to port P1, to which capacitors 106-1, 106-2, 106-3 are also coupled, and switch 148 is coupled to a node disposed between capacitor 106-3 and adjustable resistor 108-3.

FIG. 15 illustrates another example of a variable capacitance circuit 1500. Variable capacitance circuit 1500 includes a plurality of capacitors 106-1, 106-2, 106-3 disposed in parallel with one another with each capacitor 106-1, 106-2, 106-3 being disposed in series with a respective variable resistor 108-1, 108-2, 108-3. In some embodiments, variable resistors 108-1, 108-2, 108-3 include respective gate structures disposed over a respective channel region formed in a semiconductor substrate. The resistance of each variable resistor 108-1, 108-2, 108-3 is based, at least in part, on a voltage applied to the gate structure, which adjusts the resistance of the channel region.

The switched capacitor element of circuit 1500 is disposed in parallel with the series combination of capacitor 106-3 and variable resistor 108-3 and includes a capacitor 150 disposed in series with a switch 148-2. For example, capacitor 150 is coupled to port P1 and switch 148-2 is coupled to port P2. Another switch 148-1 is disposed in parallel with adjustable resistor 108-1 as switch 148-1 is coupled to a node disposed between capacitor 106-1 and adjustable resistor 108-1 and to port P2.

Figure 16:
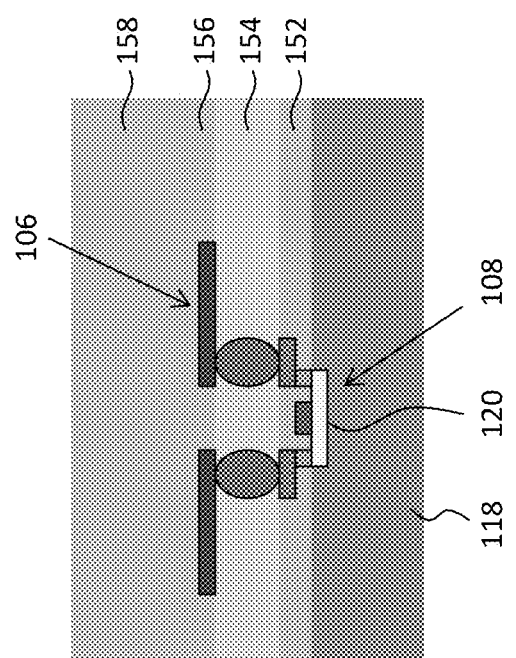
FIG. 16 is a cross-sectional view of one example of a 2.5 D integrated circuit including a variable capacitance circuit in accordance with some embodiments.

The variable capacitance circuits disclosed herein can be used in a variety of different semiconductor processing and packaging technologies. In some embodiments, the different devices are implemented in or on different substrates. For example, a variable resistor 108 can be formed in a first substrate and coupled to a capacitor 106 that is formed over a second substrate that is coupled to the first substrate using an interposer. FIG. 16 illustrates one example of a 2.5 D integrated circuit ("IC") comprising a substrate 118 in which a variable resistor 108 is formed. One or more inter-metal dielectric ("IMD") layers 152 are formed over substrate 118.

Under fill 154 is used to couple the IMD layers 154 formed over substrate 118 to the IMD layers 156 formed over an interposer 158. In some embodiments, one or more capacitors 106 are formed in the IMD layers 156 disposed over interposer 158 or one or more capacitors 106 are formed in metal layers formed over another substrate (not shown) coupled to interposer 158. Solder or μbumps 160 disposed in underfill 154 can be used to couple substrate 118 to interposer 158.

Figure 17:
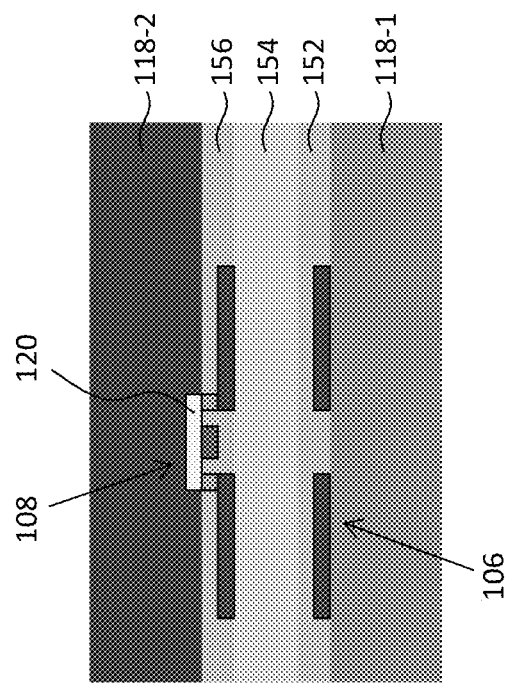
FIG. 17 is a cross-sectional view of a pair of substrates coupled together to form a variable capacitance device in accordance with some embodiments.

In some embodiments, such as the embodiment illustrated in FIG. 17, a pair of substrates 118-1, 118-2 are coupled together with one or more variable resistors 108 formed in one substrate 118-2 and one or more capacitors 106 formed over another substrate 118-1. IMD layers 152, 154 are respectively formed over substrates 118-1, 118-2 with one or more underfill layers 154 used to couple together the IMD layers 152, 154 and substrates 118-1, 118-2.

The disclosed variable capacitance devices and circuits disclosed herein advantageously utilize a variable resistor to adjust the capacitance. The use of a variable resistor enables the capacitance to be adjusted while providing higher Q values than conventional MOS varactors. Additionally, the use of a variable resistor takes up a small amount of surface area compared to other conventional variable capacitance devices and enable the capacitors to be implemented as metal-insulator-metal ("MIM") capacitors, MOM capacitors, and microelectromechanical system ("MEMS") capacitors.

In some embodiments, a variable capacitance device includes a capacitor having a first capacitance and a variable resistor coupled in series with the capacitor. The variable resistor includes a gate structure formed over a channel region defined in a doped well formed in a semiconductor substrate. A resistance of the variable resistor is based on a voltage applied to the gate structure, which adjusts a resistance of the channel and a capacitance of the variable capacitance device.

In some embodiments, the channel is defined in an upper surface of the doped well between a pair of contacts for the variable resistor that are disposed in the upper surface of the doped well.

In some embodiments, the capacitor is formed in at least one metal layer disposed over the semiconductor substrate and includes a first plate comprising a first segment extending in a first direction, and a first plurality of segments extending from the first segment in a second direction that is perpendicular to the first direction. A second plate includes a second segment disposed at a distance from the first segment and extending in the first direction, and a second plurality of segments extending from the second segment in the second direction. The second plurality of segments are interdigitated with the first plurality of segments.

In some embodiments, an isolation layer is disposed over an upper surface of the semiconductor substrate and below a lower surface of the at least one metal layer in which the capacitor plates are formed. The isolation layer is laterally spaced from the gate structure and does not overlap the doped well.

In some embodiments, the first and second segments and the first and second pluralities of segments are disposed in a first metal layer. The first plate and the second plate each include segments disposed in a second metal layer that is disposed above or below the first metal layer.

In some embodiments, the first plate includes a third segment disposed in the second metal layer and extending in the first direction, and a third plurality of segments disposed in the second metal layer and extending in the second direction. The second plate includes a fourth segment disposed in the second metal layer at a distance from the third segment and extending in the first direction, and a fourth plurality of segments disposed in the second metal layer and extending in the second direction. The second plurality of segments are interdigitated with the third plurality of segments.

In some embodiments, the capacitor includes a first plate formed in a first metal layer disposed over the semiconductor substrate and a second plate formed in a second metal layer that is located above or below the first metal layer.

In some embodiments, the variable resistor is a first variable resistor and the variable capacitance device includes a second variable resistor coupled to the first variable resistor. The second variable resistor includes a second gate structure formed over a second channel region defined in the doped well. A resistance of the second variable resistor is based on a voltage applied to the second gate structure, which adjusts a resistance of the second channel and the capacitance of the variable capacitance device.

In some embodiments, the second channel is laterally spaced from the first channel and is defined between a pair of contacts for the variable resistor that are disposed in the upper surface of the doped well.

In some embodiments, a method of fabricating a variable capacitance device includes forming a variable resistor and forming a capacitor in one or more metal layers disposed over a semiconductor substrate such that the capacitor is coupled in series with the variable resistor. A resistance of the variable resistor is based on a voltage applied to a gate structure disposed over an upper surface of the semiconductor substrate and below the one or more metal layers in which the capacitor is formed such that a resistance of a channel of the variable resistor formed in the semiconductor substrate and a capacitance of the variable capacitance device are adjusted.

In some embodiments, the method includes doping an upper surface of the semiconductor substrate to form a doped well, doping an upper surface of the doped well to form laterally spaced contacts between which the channel is located, and forming the gate structure over the upper surface of the doped well and between the laterally spaced contacts.

In some embodiments, the capacitor is a metal-oxide-metal capacitor.

In some embodiments, the capacitor is a metal-insulator-metal capacitor.

In some embodiments, the capacitor is a microelectromechanical system capacitor.

In some embodiments, a variable capacitance device includes a plurality of circuit elements arranged in parallel with each other. Each of the plurality circuit elements includes a capacitor having a first capacitance and a variable resistor coupled in series with the capacitor. The variable resistor includes a gate structure formed over a channel region defined in a doped well formed in a semiconductor substrate. A resistance of the variable resistor is based on a voltage applied to the gate structure, which adjusts a resistance of the channel and a capacitance of the variable capacitance device.

In some embodiments, the channel is defined in an upper surface of the doped well between a pair of contacts for the variable resistor that are disposed in the upper surface of the doped well.

In some embodiments, the capacitor is formed in at least one metal layer disposed over the semiconductor substrate. The capacitor includes a first plate and a second plate. The first plate includes a first segment extending in a first direction and a first plurality of segments extending from the first segment in a second direction that is perpendicular to the first direction. The second plate includes a second segment disposed at a distance from the first segment and extending in the first direction and a second plurality of segments extending from the second segment in the second direction. The second plurality of segments are interdigitated with the first plurality of segments.

In some embodiments, an isolation layer is disposed over an upper surface of the semiconductor substrate and below a lower surface of the at least one metal layer in which the capacitor plates are formed. The isolation layer is laterally spaced from the gate structure and not overlapping the doped well.

In some embodiments, the first and second segments and the first and second pluralities of segments are disposed in a first metal layer. The first plate and the second plate each include segments disposed in a second metal layer that is disposed above or below the first metal layer.

In some embodiments, the first plate includes a third segment disposed in the second metal layer and extending in the first direction and a third plurality of segments disposed in the second metal layer and extending in the second direction. The second plate includes a fourth segment disposed in the second metal layer at a distance from the third segment and extending in the first direction and a fourth plurality of segments disposed in the second metal layer and extending in the second direction. The second plurality of segments are interdigitated with the third plurality of segments.

Although the devices, circuits, and methods have been described in terms of exemplary embodiments, they are not limited thereto. Rather, the appended claims should be construed broadly, to include other variants and embodiments of the devices, circuits, and methods, which may be made by those skilled in the art without departing from the scope and range of equivalents of the devices, circuits, and methods.

What is claimed is:

1. A variable capacitance device, comprising:
    a capacitor having a first capacitance, the capacitor formed in at least one metal layer disposed over a semiconductor substrate and including:
        a first plate comprising
            a first segment extending in a first direction, and
            a first plurality of segments extending from the first segment in a second direction that is perpendicular to the first direction; and
        a second plate comprising
            a second segment separate from the first segment and extending in the first direction, and
            a second plurality of segments extending from the second segment in the second direction, the second plurality of segments being interdigitated with the first plurality of segments;
    a variable resistor including a gate structure formed over a channel region defined in a doped well formed in the semiconductor substrate;
    at least one interconnect connecting the first plate of the capacitor to the gate structure of the variable resistor; and
    a shielding layer formed of a conductive material disposed over an upper surface of the semiconductor substrate and below a lower surface of the at least one metal layer in which the capacitor plates are formed, the shielding layer being laterally spaced from the gate structure and not overlapping the doped well,
    wherein a resistance of the variable resistor is based on a voltage applied to the gate structure, which adjusts a resistance of the channel and a capacitance of the variable capacitance device.

2. The variable capacitance device of claim 1, wherein the channel is defined in an upper surface of the doped well between a pair of contacts for the variable resistor that are disposed in the upper surface of the doped well.

3. The variable capacitance device of claim 1, wherein the first and second segments and the first and second pluralities of segments are disposed in a first metal layer, and wherein the first plate and the second plate each include segments disposed in a second metal layer that is disposed above or below the first metal layer.

4. The variable capacitance device of claim 3, wherein the first plate includes
   a third segment disposed in the second metal layer and extending in the first direction, and
   a third plurality of segments disposed in the second metal layer and extending in the second direction; and
the second plate includes
   a fourth segment disposed in the second metal layer at a distance from the third segment and extending in the first direction, and
   a fourth plurality of segments disposed in the second metal layer and extending in the second direction, the second plurality of segments being interdigitated with the third plurality of segments.

5. The variable capacitance device of claim 1, wherein the variable resistor is a first variable resistor and the variable capacitance device includes a second variable resistor coupled to the first variable resistor, the second variable resistor including
   a second gate structure formed over a second channel region defined in the doped well, wherein a resistance of the second variable resistor is based on a voltage applied to the second gate structure, which adjusts a resistance of the second channel and the capacitance of the variable capacitance device.

6. The variable capacitance device of claim 5, wherein the second channel is laterally spaced from the first channel and is defined between a pair of contacts for the variable resistor that are disposed in the upper surface of the doped well.

7. A method of fabricating a variable capacitance device, comprising:
   forming a variable resistor including a gate structure disposed over a doped well;
   forming a shielding layer from a conductive material over an upper surface of a semiconductor substrate, the shielding layer being laterally spaced from the gate structure and not overlapping the doped well; and
   forming a capacitor in one or more metal layers disposed over the semiconductor substrate and the shielding layer such that the capacitor is coupled in series with the variable resistor, the capacitor comprising
      a first plate comprising
         a first segment extending in a first direction, and
         a first plurality of segments extending from the first segment in a second direction that is perpendicular to the first direction; and
      a second plate comprising
         a second segment disposed at a distance from the first segment and extending in the first direction, and
         a second plurality of segments extending from the second segment in the second direction, the second plurality of segments being interdigitated with the first plurality of segments,
   wherein a resistance of the variable resistor is based on a voltage applied to the gate structure disposed over an upper surface of the semiconductor substrate and below the one or more metal layers in which the capacitor is formed such that a resistance of a channel of the variable resistor formed in the semiconductor substrate and a capacitance of the variable capacitance device are adjusted; and
   connecting the first plate of the capacitor to the gate structure of the variable resistor.

8. The method of claim 7, further comprising:
   doping an upper surface of the semiconductor substrate to form a doped well;
   doping an upper surface of the doped well to form laterally spaced contacts between which the channel is located; and
   forming the gate structure over the upper surface of the doped well and between the laterally spaced contacts.

9. The method of claim 7, wherein the capacitor is a metal-oxide-metal capacitor.

10. The method of claim 7, wherein the capacitor is a metal-insulator-metal capacitor.

11. The method of claim 7, wherein the capacitor is a microelectromechanical system capacitor.

12. A variable capacitance device, comprising:
   a plurality of circuit elements arranged in parallel with each other, each of the plurality circuit elements including
      a capacitor having a first capacitance, the capacitor formed in at least one metal layer disposed over a semiconductor substrate and includes
      a first plate comprising
         a first segment extending in a first direction, and
         a first plurality of segments extending from the first segment in a second direction that is perpendicular to the first direction; and
      a second plate comprising
         a second segment disposed at a distance from the first segment and extending in the first direction, and
         a second plurality of segments extending from the second segment in the second direction, the second plurality of segments being interdigitated with the first plurality of segments;
   a variable resistor including a gate structure formed over a channel region defined in a doped well formed in the semiconductor substrate;
   at least one interconnect connecting the first plate of the capacitor to the gate structure of the variable resistor; and
   a shielding layer formed of a conductive material disposed over an upper surface of the semiconductor substrate and below a lower surface of the at least one metal layer in which the capacitor plates are formed, the shielding layer being laterally spaced from the gate structure and not overlapping the doped well,
   wherein a resistance of the variable resistor is based on a voltage applied to the gate structure, which adjusts a resistance of the channel and a capacitance of the variable capacitance device.

13. The variable capacitance device of claim 12, wherein the channel is defined in an upper surface of the doped well between a pair of contacts for the variable resistor that are disposed in the upper surface of the doped well.

14. The variable capacitance device of claim 12, wherein the first and second segments and the first and second pluralities of segments are disposed in a first metal layer, and wherein the first plate and the second plate each include segments disposed in a second metal layer that is disposed above or below the first metal layer.

15. The variable capacitance device of claim 14, wherein the first plate includes
   a third segment disposed in the second metal layer and extending in the first direction, and
   a third plurality of segments disposed in the second metal layer and extending in the second direction; and the second plate includes
- a fourth segment disposed in the second metal layer at a distance from the third segment and extending in the first direction, and
- a fourth plurality of segments disposed in the second metal layer and extending in the second direction, the second plurality of segments being interdigitated with the third plurality of segments.

* * * * *